United States Patent [19]
Riggio, Jr.

[11] Patent Number: 5,452,250
[45] Date of Patent: Sep. 19, 1995

[54] NON-VOLATILE REGISTER SYSTEM UTILIZING THIN-FILM FLOATING-GATE AMORPHOUS TRANSISTORS

[75] Inventor: Salvatore R. Riggio, Jr., Boca Raton, Fla.

[73] Assignee: International Business Machines, Inc., Armonk, N.Y.

[21] Appl. No.: 261,356

[22] Filed: Jun. 14, 1994

[51] Int. Cl.⁶ ............................................. G11C 16/06
[52] U.S. Cl. .................................. 365/185; 365/221; 365/189.05; 365/189.12; 365/233; 257/316
[58] Field of Search .............. 365/185, 189.05, 189.12, 365/221, 233; 257/316

[56] References Cited

U.S. PATENT DOCUMENTS

| | | | |
|---|---|---|---|
| 4,460,978 | 7/1984 | Jiang et al. | 365/154 |
| 4,467,451 | 8/1984 | Moyer | 365/156 |
| 4,538,246 | 8/1985 | Wang et al. | 365/226 |
| 4,595,999 | 6/1986 | Betirac | 365/154 |
| 4,635,229 | 1/1987 | Okumura et al. | 365/154 |
| 5,315,546 | 5/1994 | Ochii | 365/185 |
| 5,321,286 | 6/1994 | Koyama et al. | 365/185 |
| 5,338,956 | 8/1994 | Nakamura | 257/316 |
| 5,350,938 | 9/1994 | Matsukawa et al. | 257/316 |

FOREIGN PATENT DOCUMENTS

0345058A2  6/1989  European Pat. Off.

OTHER PUBLICATIONS

R. A. Street, "Amorphous silicon electronics", pp. 70–75, MRS Bulletin, Nov. 1992.
M. Shur and M. Tack, "Physics of amorphous silicon based allow field-effect transistors", J. App. Phys, 55(10), 15 May 1984, pp. 3831–3842.
Michael Shur, "Physics of semiconductor devices", Prentice Hall, 1990, pp. 437–446.
Arun Madan and Melvin P. Shaw, "The physics and applications of amorphous semiconductors", Academic Press 1988, chapters 2 and 3 (pp. 35–317).

Primary Examiner—Joseph E. Clawson, Jr.
Attorney, Agent, or Firm—Paul T. Kashimba; Martin J. McKinley; Douglas R. McKechnie

[57] ABSTRACT

A shift register comprises a plurality of amorphous silicon thin-film transistors configured in a plurality of register cells through which data is shifted through a plurality of amorphous silicon thin-film floating-gate transistors. In the event power is cutoff or lost, the floating gate transistors non-volatilely store the data which can be recovered or restored when power is subsequently turned on. Each cell comprises two stages in which data signals are written before being input into the next stage and next cell. A clock generator receives clocking signals for controlling the shifting of data through the register.

10 Claims, 4 Drawing Sheets

NON-VOLATILE REGISTER SYSTEM UTILIZING THIN-FILM FLOATING-GATE AMORPHOUS TRANSISTORS

BACKGROUND OF THE INVENTION

1. Field of the Invention

This invention relates to the field of data processing, and, more particularly, to improved non-volatile shift register having amorphous silicon thin-film floating-gate transistors which non-volatilely store data in the event power is turned off or lost.

2. Description of Related Art

Amorphous thin-film transistors provide a technology that is advantageous for large area, low cost integrated circuits. One type of such transistors has a floating gate that can be used to provide non-volatile storage of data. There are many different devices commonly used in digital circuits which temporarily store data and wherein the data is lost when power is turned off and in the event of a power failure. Standard registers are examples of such devices. The invention is directed generally to an improved register in which amorphous silicon thin-film floating-gate transistors are used to buffer or temporarily store data while power is turned on and to non-volatilely store data in the event power is lost or turned off. The invention is also directed specifically to an improved shift register providing a serial-in, serial-out flow of data in which amorphous silicon thin-film floating-gate transistors are used to buffer or temporarily store the data while power is turned on and to non-volatilely store data in the event power is lost or turned off. Such preservation of the data may advantageously be used for diagnostic, start-up, and resume operations.

It is recognized that floating gate transistors have been implemented using crystalline semiconductor material. Such transistors are operated by injecting a charge onto the floating gate by means of an avalanche breakdown of the insulator surrounding the floating gate. Such transistors find use in erasable programmable read only memories (EPROM) where the injected charge can be non-volatilely stored for long periods of time when power is off. However, crystalline floating gate transistor devices have limited use otherwise since it requires a relatively long period of time to erase the charge and reprogram the device, and the insulator has a limited life due to the deleterious effect of the avalanche breakdown.

SUMMARY OF THE INVENTION

One of the objects of the invention is to provide an improved register in which amorphous silicon thin-film floating-gate transistors are used to buffer or temporarily store data while the register is being operated and to non-volatilely store data in the event power is lost or turned off.

A further object of the invention is to provide an improved shift register in which amorphous silicon thin-film floating-gate transistors are used to buffer or temporarily store data as the data is shifted through the register and to non-volatilely store data in the event power is lost or turned off.

Another object of the invention is to provide an improved integrated circuit shift register in which amorphous silicon thin-film transistors are used throughout the register.

Briefly, in accordance with the invention, a register comprises a plurality of amorphous thin-film transistors configured in a plurality of register cells on which data is shifted between amorphous thin-film floating-gate transistors. In the event power is cutoff or lost, the floating gate transistors non-volatilely store the data so that such data can be recovered or restored when power is subsequently turned on.

BRIEF DESCRIPTION OF THE DRAWINGS

Other objects and advantages of the invention will be apparent from the following description taken in connection with the accompanying drawings wherein.

DESCRIPTION OF ILLUSTRATIVE EMBODIMENT

Figure 1:
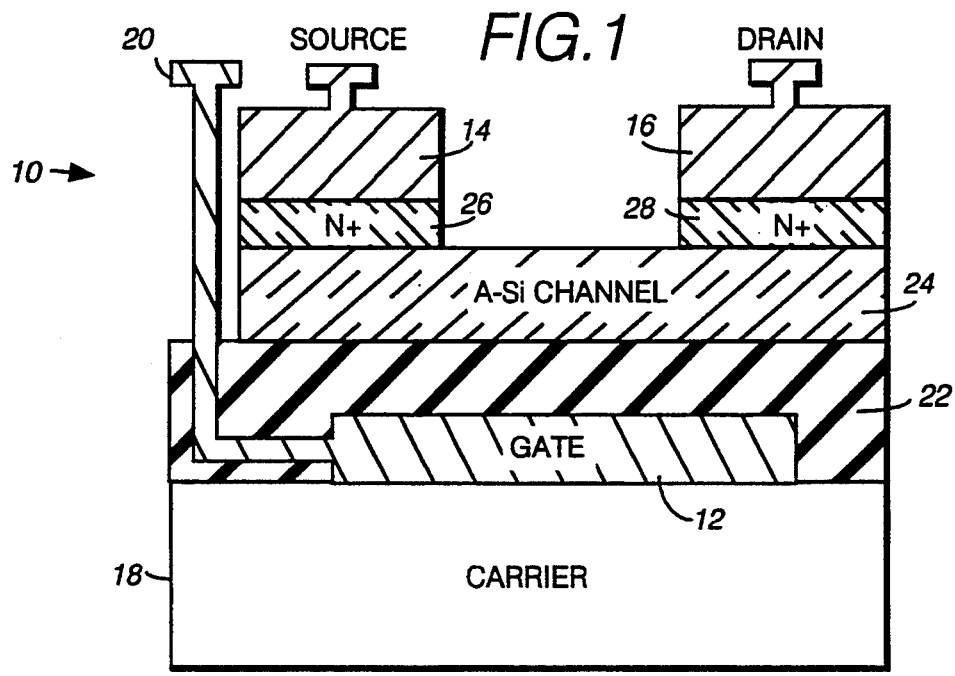
FIG. 1 is a schematic diagram of an amorphous silicon thin-film transistor used in the invention.

Referring now to the drawings, FIG. 1 schematically shows a basic transistor 10 which is a three terminal, amorphous-silicon (A-Si) thin-film field effect transistor 10 having a gate 12, a source 14, and a drain 16. Gate 12 is made of aluminum deposited on a non-conductive carrier 18. A layer 22 of insulating material covers gate 12, and a thin film A-Si N-channel 24 is deposited on layer 22. An N-channel is a channel through the A-Si in which the majority carriers are electrons. The upper portions of source 14 and drain 16 are made of aluminum and form contacts or terminals to which other metal lines can be joined allowing the transistor to be integrated into a circuit, the upper portions being deposited on ohmic contacts 26 and 28. These ohmic contacts in turn are deposited at spaced positions on channel 24. Contacts 26 and 28 are preferably formed of N-type semiconductor material. Gate 12 also includes a terminal portion 20 that extends through insulating layer 22. During operation, the presence of a positive (relative to the source) voltage on the gate creates an electric field that causes channel 24 to be conductive allowing current to flow between the source and drain. Basic transistor 10 is used for a variety of configurations and functions including current limiting devices, inverters, source followers, electronic switches, and analog switches, as described in more detail below. A-Si thin film transistors can be deposited on a variety of substrate materials, such as glass, quartz or plastic. The substrate material can be either rigid or flexible, and can be comparatively large (for example, 8" by 8" ) The construction of thin film transistors is well known in the art. (See, for example, Nick Hall, Jr., Prentice Hall Series In Solid State Physical Electronics, pp 437–446, Prentice Hall, 1990).

Figure 2:
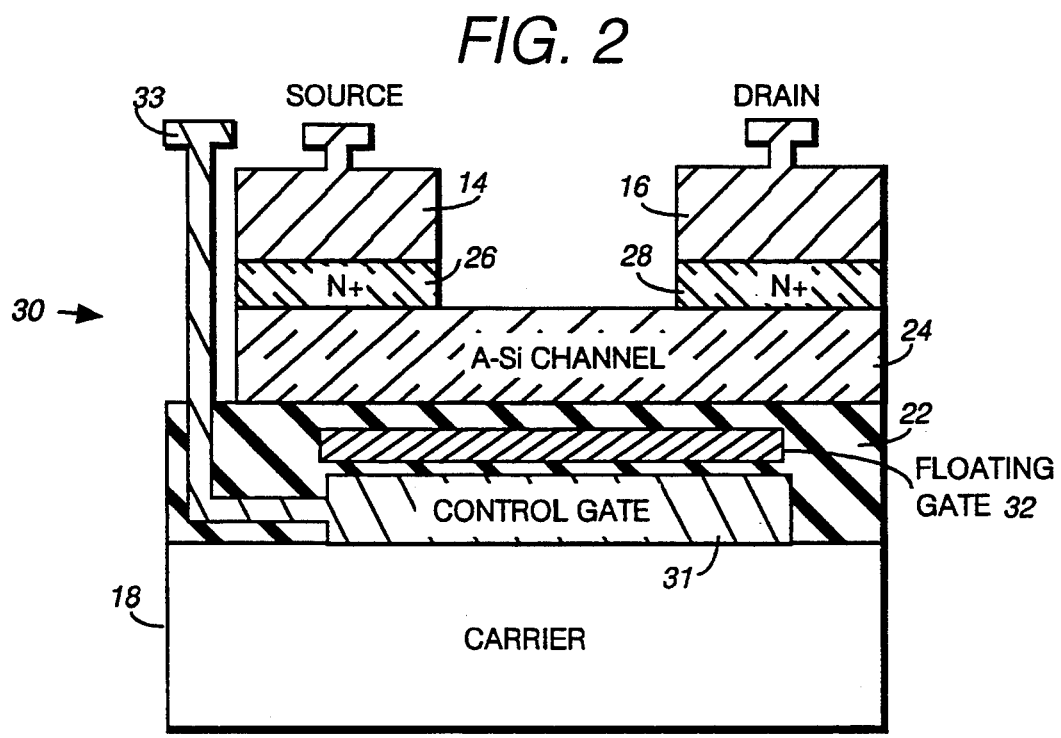
FIG. 2 is a schematic diagram of an amorphous silicon thin-film floating-gate transistor used in the invention.

With reference to FIG. 2, there is shown an amorphous-silicon (A-Si) thin-film floating-gate field-effect transistor 30 that is referred to in the specification and claims simply as a "floating gate" transistor to distinguish it from a "basic" transistor. Transistor 30 has a structure similar to that of transistor 10 except for the addition of a floating gate 32 that is fully enclosed or embedded in insulator 22 between a control gate 31 and channel 24. The floating gate 32 is closer to control gate 31 than it is to either the drain or the source and is capacitively coupled with the control gate, the gate, and the source to form three parallel plate capacitors. Transistor 30 is used as a data storage device where the capacitive charging of these capacitors controls the conduction of the channel and represents a bit of information, in the manner described hereinafter. Insulator 22 has a high resistivity against leakage current so that the capacitors can retain a charge for long periods of time when power is off. An insulator made of silicon nitride or polystyrene retains a charge for a period of at least six months. Transistor 30 is also fabricated using the thin film process described above. When a positive voltage of level +Vdd is applied to control gate 31, channel 24 becomes conductive, and when a negative voltage of level −Vss is applied to gate 12, channel 24 becomes non-conductive.

Figure 3:
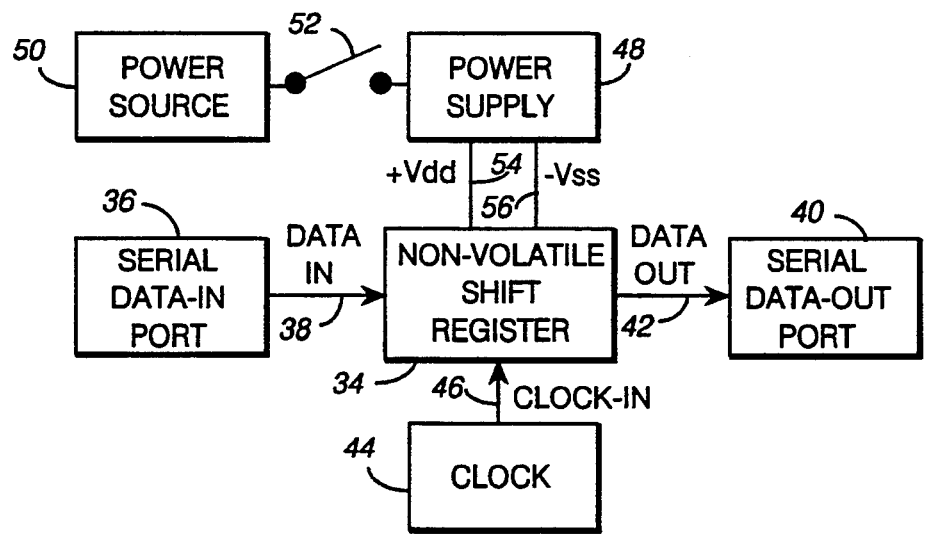
FIG. 3 is a block diagram of a portion of a data processing system that embodies the invention.

Referring to FIG. 3, a non-volatile shift register 34 is part of a data processing system that also includes two serial data ports 36 and 40, a power source 50, ON-OFF switch 52, a power supply 48, and a clock 44. Port 36 is a source of serial data that are supplied as DATA-IN signals on input line 38. Port 40 is connected to the output of register 34 by line 42 and receives DATA-OUT signals. Clock 44 may be selectively operated continuously or intermittently so that data is being streamed through the register with a delay between when the data is received and when that data is shifted out. In synchronism with the serial data signals, clock 44 generates CLOCK-IN signals that are transmitted over line 46 into register 34 for controlling the shifting of data into, through, and out of register 34, in the manner described in detail below. Power source 50 can be either or both of an AC power source or a DC power source such as from a battery or a converter. Switch 52 is selectively actuated and, when closed, connects power source 50 to power supply 48 which, in response, supplies +Vdd and −Vss voltages to register 34 over voltage supply lines 54 and 56. The data in register 34 is stored in a non-volatile manner during periods in which power source 50 is turned off, disconnected, or fails. The data thus stored can be recovered by actuating clock 44 to shift the data out of the register, once power is turned on.

Figure 4:
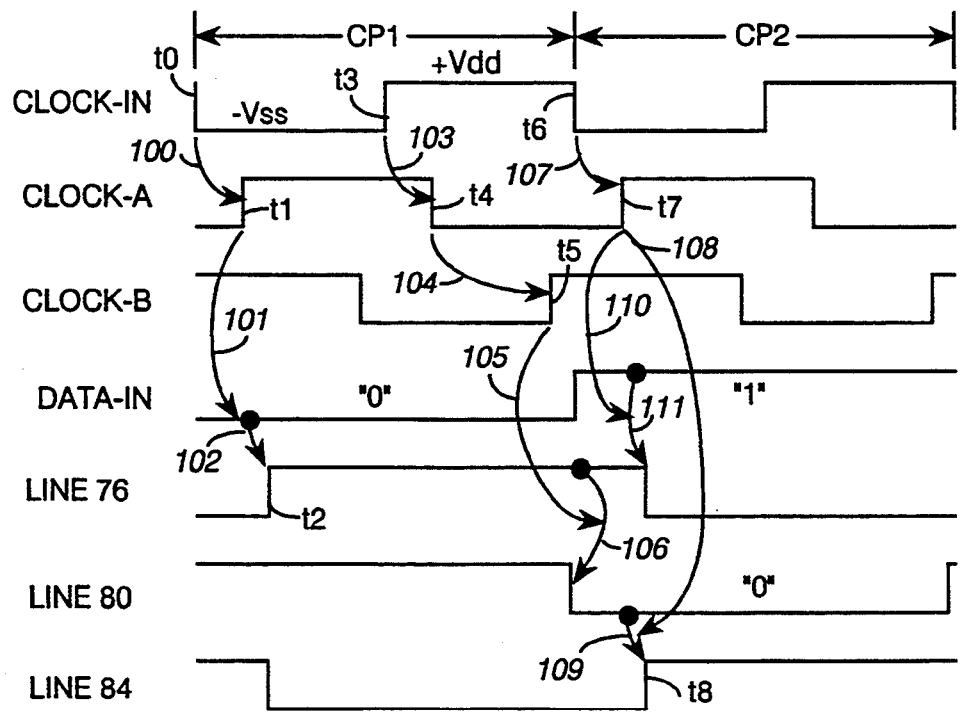
FIG. 4 is a timing diagram of various signals generated during the course of operation of the invention.

As shown in FIG. 4, the CLOCK-IN signal is a train of periodic, equal width pulses having a 1-millisecond clock period (CP). The magnitude of the signals shown in FIG. 4. vary between +Vdd and −Vss voltages that represent the high and low signal levels. The DATA-IN signal is driven in synchronization with the CLOCK-IN signal so that the data is stable when the CLOCK-IN signal goes positive. The DATA-IN signal uses a −Vss voltage to represent a "0" bit and a +Vdd to represent a "1" bit. The remaining signals are described below with reference to details of the circuit diagram shown in FIG. 5. Exemplary voltage levels for +Vdd and −Vss are ±30-volts, which levels can be readily converted to a standard five-volt logic level for use with circuits requiring such standard logic level.

Figure 5A:
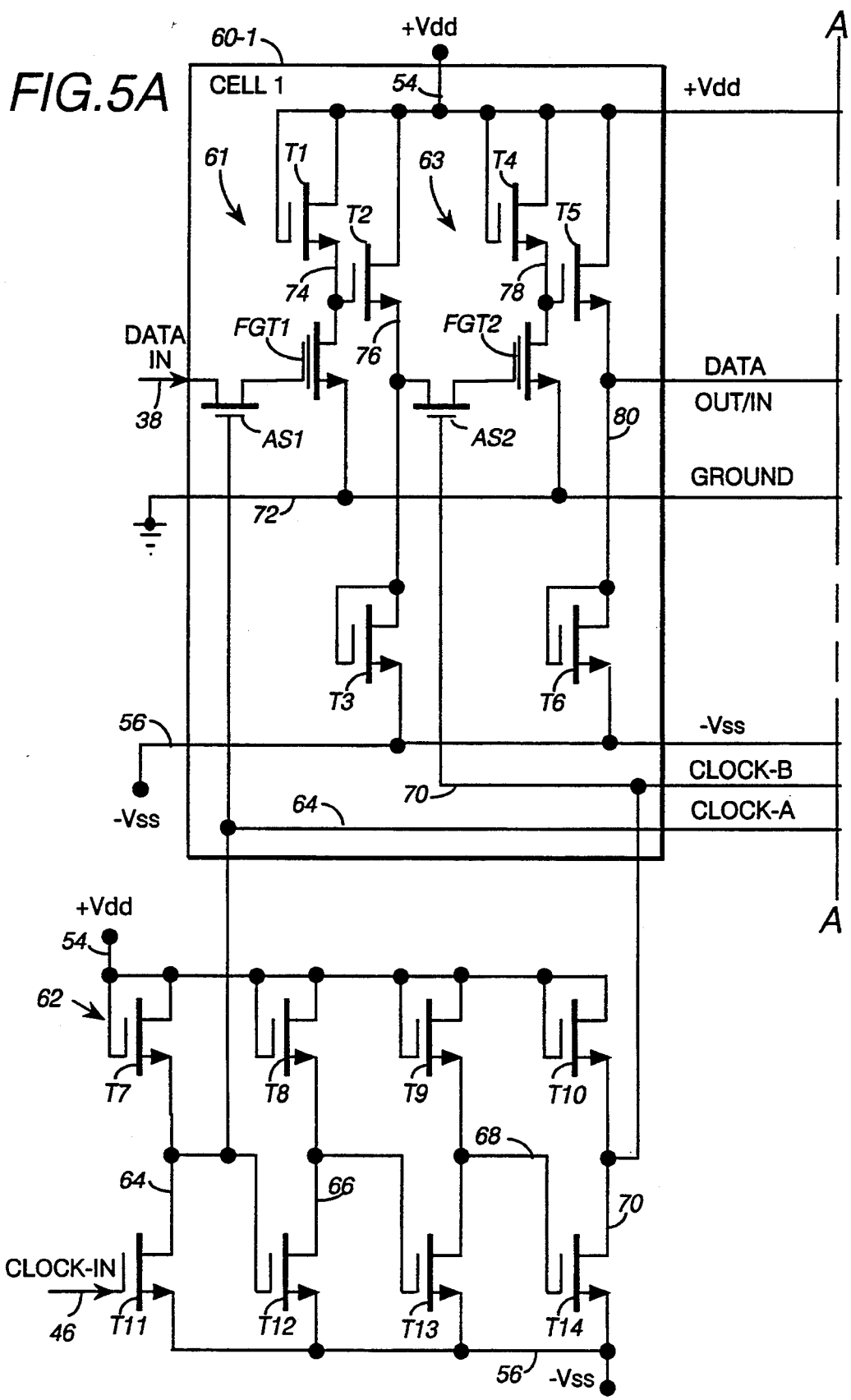
FIGS. 5A and 5B, when joined along reference lines A—A, form a schematic circuit diagram of the shift register shown in FIG. 4.
Figure 5B:
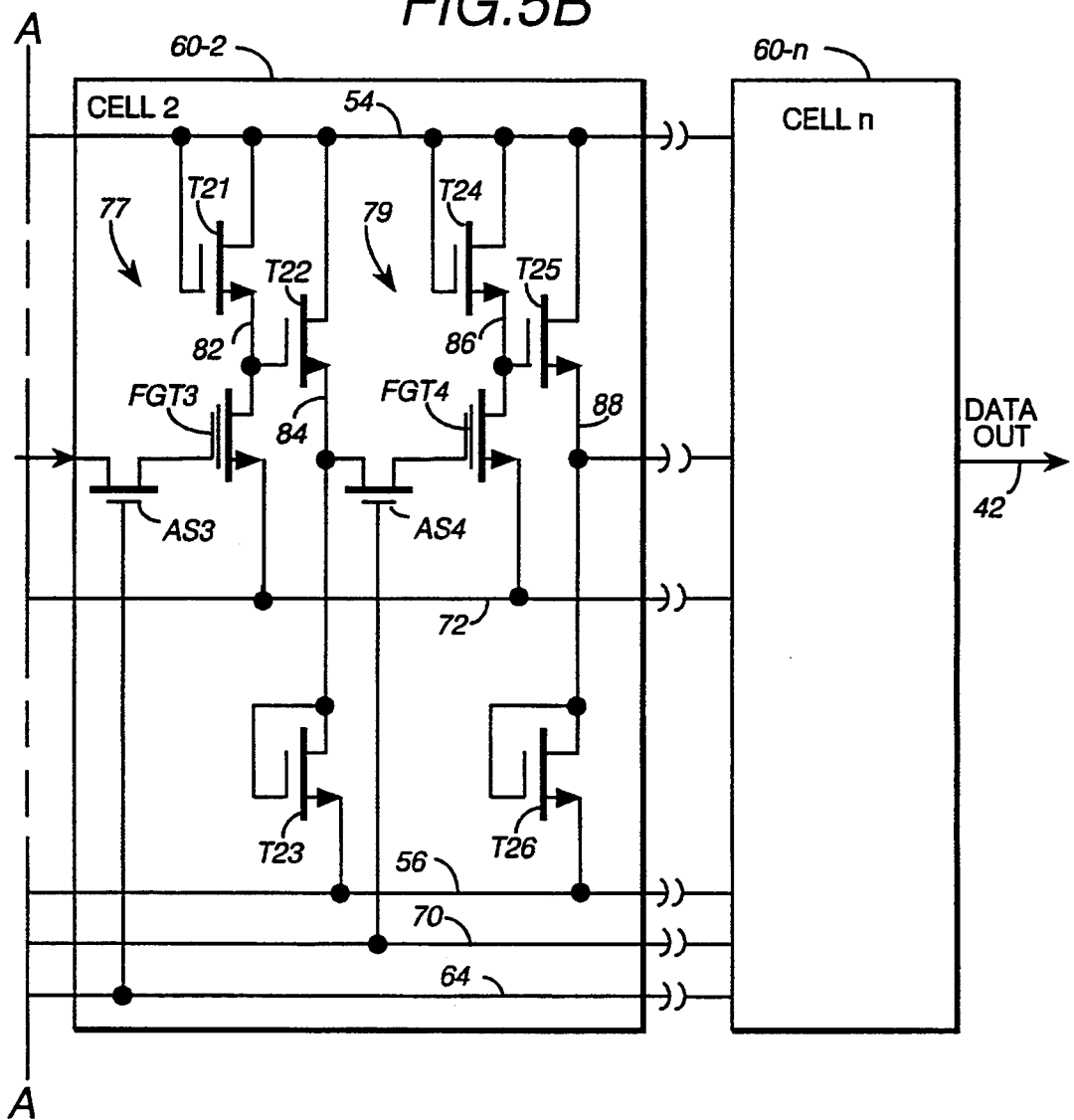
Figure 5C:
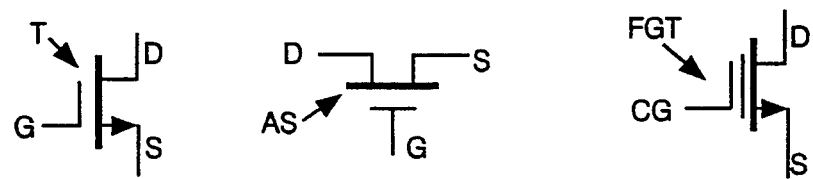
FIG. 5C illustrates various symbols used in FIGS. 5A and 5B to represent different transistors.

FIG. 5C illustrates different transistor symbols used in FIGS. 5A and 5B to represent a basic transistor T, an analog switch AS, and a floating gate transistor FGT.

The gates, control gates, drains and sources are indicated in FIG. 5C by the letters "G" "CG" "D" and "S" but such letters have been omitted from FIGS. 5A and 5B to avoid cluttering.

With reference to FIGS. 5A and 5B, shift register 34 is preferably formed as an integrated circuit in which the various amorphous transistors are created on a common carrier, the transistors being interconnected or coupled by metallization lines that carry the signals. Register 34 comprises "n" dual-stage, register cells 60-1 to 60-n, and a clock generator 62. The number "n" of cells is a matter of choice dependent upon the particular purpose or application. Typically, register 34 has eight, sixteen, or thirty two cells for storing a like number of bits. The first register cell 60-1 is an input register cell into which the serial data is written, and the last register cell 60-n is an output register cell from which the serial data can be read. Clock generator 62 provides data shifting or timing signals concurrently to all of register cells 60.

Clock generator 62 receives a CLOCK-IN signal on line 46 and generates in response thereto a CLOCK-A signal and a CLOCK-B signal. As described in more detail below, CLOCK-A signals are used to shift data into and between the cells while CLOCK-B signals are used shift data between stages of the cells. Generator 62 comprises four transistors T11, T12, T13, and T14 that form switches connected in parallel between voltage lines 54 and 56. Transistors T11–T14 are conductive when the gate voltages are positive or high and non-conductive when the gate voltages are negative or low. Four transistors T7–T10 are respectively connected in series with transistors T11–T14 and in parallel with each other between voltage lines 54 and 56. Transistors T7–T10 have their gates and drains connected in common to thereby act load devices for limiting the flow of current through the transistor switches. With such configuration, switches T11–T14 act as inverters that operate with predetermined circuit delays. For example, when the gate of T11 is high, T11 conducts so that the source thereof and line 64 are tied to −Vss with a negligible voltage drop through T11. The signal on line 64 is inverted relative to the gate signal after a short circuit delay.

A line 64 interconnects the drain of T11, the source of T7, the gate of T12 and the gate of AS1 and transmits the CLOCK-A signal therebetween. Line 64 also carries the CLOCK-A signal to corresponding ASs of all of the other register cells. The switching action of T11 causes CLOCK-A to be inverted at the end of a predetermined circuit delay time after the CLOCK-IN signal changes. Relative to the timing signals in FIG. 4, the CLOCK-A signal is generated as follows. Starting just prior to time t0, when CLOCK-IN is high, T11 is conductive or on, and line 64 is coupled to the low signal (inverted relative to the high gate input on line 56). When CLOCK-IN goes low at time t0, switch T11 becomes non-conductive thereby decoupling line 64 from line 56 causing line 64 to go high at time t1 after a short circuit delay.-Subsequently, when CLOCK-IN goes positive at t2, CLOCK-A goes low at t3.

The positive going signal of CLOCK-A at t1 is applied to the gate of switch T12 thereby switching T12 from a non-conductive state to a conductive state and causing the voltage on line 66 to go negative. Line 66 is connected between the drain of T12, the source of T8, and the gate of T13. When line 66 goes negative, switch T13 becomes non-conductive thereby causing the voltage on line 68 to go positive. Line 68 is connected to the drain of T13, the source of T9, and the gate of T14. When line 68 goes positive, switch T14 is turned off thereby causing the voltage on line 70 to go negative. The voltage on line 70 is the CLOCK-B signal that is transmitted to the gates of AS2 and corresponding ASs in each of the register cells. The switching action of switches T12-T14 introduce three short circuit delays before CLOCK- B changes relative to CLOCK-A. The switching of CLOCK-B occurs four circuit delays after CLOCK-IN changes. The circuit delays are short enough to occur within one-half of a clock period so that CLOCK-B falls at time t4 and before CLOCK-IN rises at time t2. When CLOCK-IN rises at t2, the actuation of the transistor switches reverses relative to the operation just described. Thus, in response to CLOCK-IN going positive at t2, switch T11 is turned on and CLOCK-A goes negative at t3. This causes T12 to be turned off, T13 to be turned on, and T14 to be turned off causing CLOCK-B to go positive at time t5. It should be thus apparent that CLOCK-A inversely follows CLOCK-IN with one delay time, and CLOCK-B inversely follows CLOCK-A with three delay times while directly following CLOCK-IN with four delay times.

Each of register cells 60 is similar so that only one (60-1) need be described in detail with respect to its own structure and operation and to its relationship to the next cell (register cell 60-2). Register cell 60-1 comprises two stages 61 and 63 that operate under the control of CLOCK-A and CLOCK-B signals respectively. Stage 61 is the first or input stage of cell 60-1 and comprises AS1, FGT1, T1, T2 and T3. The drain and source of switch AS1 are connected to data input line 38 and to the gate of FGT1. When the gate of AS1 goes positive, AS1 becomes conductive and the voltage signal applied to the control gate of FGT1 follows the data input signal and swings positive or negative in accordance therewith. When AS1 is subsequently turned off, the floating gate of FGT1 retains a charge that is either positive of negative, relative to the source and drain, in accordance with the level of the DATA-IN signal at the time AS1 is turned off. The high resistivity of the insulator of FGT1 prevents current leakage internally within the FGT. AS1, when non-conductive (turned off) also has a high resistivity and isolates the control gate of FGT1 so there is no external leakage of the stored charge through circuits external to the FGT.

The source of FGT1 is coupled with a ground line 72, while the drain of FGT1 is coupled by line 74 to the source of transistor T1 and to the gate of transistor T2. Ground line 72 provides a center reference point. The gate and drain of transistor T1 are connected in common to voltage supply line 54 and receive +Vdd voltage. Transistor T1 is thus configured as a load device for limiting current flow through the drain, channel, and source of FGT1. When FGT1 is conductive, line 74 is pulled down to ground whereas line 74 is pulled up to +Vdd when FGT1 is non-conductive. Transistor T2 is connected as a source follower to shift voltage levels between lines 74 and 76. The drain of transistor T2 is connected to line 54 and is at +Vdd while its source is connected by line 76 to the drain of AS2 and to the drain and gate of transistor T3. The source of T3 is connected to line 56 and is at −Vss. T3 is thus connected as a load device to the source of T2. The voltage on line 74 is above the voltage on line 76 by a relatively constant amount producing a voltage level shift thereby allowing the voltage applied to AS2 to be either positive or negative dependent on whether FGT1 is on or off. If FGT1 is off, the voltage applied to AS2 is positive, and if FGT1 is on, the voltage applied to AS2 is negative.

Stage 63 is the second or output stage of cell 60-1 and comprises AS2, FGT2, T4, T5, and T6 which are identical to AS1, FGT1, T1, T2, and T3, with line 76 acting as the data input line into the stage and with AS2 being controlled by the CLOCK-B signal on line 70. Line 80 forms the data-out line from stage 63 and register cell 1. Line 80 also is the data-in line for the next register cell 60-2, and the signal carried by line 80 is denoted a DATA OUT/IN signal.

Further operation of register cell 1 will now be explained relative to FIG. 4 using an example of shifting two bits of data into the register, the first bit being a "0" defined by a negative DATA-IN signal, and the second bit being a "1" defined by a positive DATA-IN signal. For such input, the DATA-IN signal is driven negative by port 36 for a first clock period CP1 and positive for a second clock period CP2 such that the data signal is stable when the CLOCK-IN signal goes positive during each period. Each clock period is of one millisecond duration and defines a write cycle during which date is written and shifted.

In response to the CLOCK-IN signal going negative at time t0, transistor T11 inverts the signal and drives CLOCK-A positive (as indicated by arrow 100) at time t1. In response to CLOCK-A going positive at time t1, switch AS1 becomes conductive (arrow 101) causing the first bit to be inputted into the first stage 61 of cell 60-1 so that the output line 76 of such stage produces (as indicated by arrow 102) a voltage signal at t2 indicative of such bit. During such operation, the control gate of FGT1 receives a negative DATA-IN signal representing the "0" bit, which causes FGT1 to become non-conductive, and line 74 is pulled up high causing line 76 to go positive at time t2. In other words, the DATA-IN signal is transferred and inverted from the input data line to line 76. At t3, CLOCK-IN goes high causing (arrow 103) CLOCK-A to go low at t4 thereby opening AS1 and decoupling or disconnecting the control gate of FGT1 from the DATA-IN signal. The "0" data bit is thus written or stored in FGT1 for the remainder of period CP1 and the signal on line 76 provides the output signal, from stage 61, which is high and represents the "0" bit.

At this point, further discussion of the theory of operation of A-Si amorphous FGTs may provide a better understanding of the invention. As indicated previously above relative to FIG. 2, FGT 30 has three capacitors formed by the capacitive coupling between control gate 31 and floating gate 32, between source 14 and floating gate 32, and between drain 16 and floating gate 32. The floating gate is common to all three capacitors. The field effect due to the voltage between floating gate 32 and source 14 determines if channel 24 is conductive or not. However, the two capacitors (control gate/floating gate and floating gate/source) are in series and act as a voltage divider. Since the floating gate is closer to the control gate than to the source, there is a greater capacitance and hence a lesser voltage drop across the control gate/floating gate capacitor. Thus, in order to develop the necessary voltage between the floating gate and the source for controlling conductivity, it is necessary to apply a relative high voltage (±30-volts) since the voltage drop, occurring between the control gate and the floating gate, is lost or not available for directly controlling conductivity. The data signal applied to control gate 31 causes current to flow and charge the capacitors The capacitors remain charged when AS1 opens due to the high resistance in all directions and the fact there is no low impedance leakage path. In contrast to floating gate transistors formed with crystalline semiconductor material, the A-Si FGTs used in the invention operate using a capacitive charge transference and do not use breakdown voltages and avalanche breakthroughs of the insulator surrounding the floating gate.

When AS1 thus is turned off at t4, AS2 is off. In response to CLOCK-A going low at t4, CLOCK-B subsequently goes high at t5 (arrow 104) and such signal turns AS2 on (arrow 105) thereby transferring (arrow 106) the first bit from input stage 61 into output stage 63 of cell 60-1. During the transfer, the positive signal on line 76 drives the control gate of FGT2 positive to thereby turn FGT2 on causing line 78 to go low and drive line 80 negative. This negative signal represents the "0" bit at the output of stage 63 and cell 60-1.

At the beginning of period CP2, CLOCK-IN goes low at t6 causing (arrow 107) CLOCK-A to go high at t7. It is to be recalled that the CLOCK-A and CLOCK-B signals are transmitted to each of the cells of the register, so that the CLOCK-A signal turns on AS3 in cell 60-2, as indicated by arrow 108. AS3 couples FGT3 with the input data signal from line 80 which signal is inverted and level shifted by T22 and T23 to drive line 84 high at t9. Such high signal represents the first bit "0" at it appears at the output of stage 77 and input to stage 79. This first bit is then propagated and transferred through stage 79 in the same manner as it was through stage 63, and through the remaining cells of register 34. At the end of "n" clock periods, the first bit will be transmitted from the data out line 42 of the register.

Concurrently with the first bit being inputted into cell 60-2, the positive CLOCK-A pulse at t7 also closes AS1 (arrow 110) thereby coupling the positive DATA-IN signal to FGT1 causing line 76 to be driven negative to represent the second bit. The second bit is then shifted through the remainder of the register in the same manner as the first bit. It should be obvious that a stream of data bits are shifted through the register in a similar fashion. Should power be lost at any time, the data bits stored in the FGTs will remain for a period of many months in the event power is not restored. When power is restored, the data in register 34 can be recovered simply by operating clock 44 for "n" clock periods to shift the data out of the register through port 40.

Register cell 60-2 comprises two stages 77 and 79 identical to stages 61 and 63. Stage 77 comprises AS3, FGT3, T21, T22, and T23 in which the output line 84 of stage 77 is connected to the input (drain of AS4) of stage 79. Stage 79 comprises AS4, FGT4, T24, T25, and T26, and output line 88. The remaining cells 60-3 to 60-n are constructed and operate in the same manner as cells 60-1 and 60-2.

It should be apparent that for "n" register cells 60, "n" clock pulses are needed to write "n" serial bits into the register and another "n" clock pulses are needed to read those bits out of the register. In response to the clock A pulses, the data bits on data in line 38 are written into the first stage of cell 60-1 while the data bits on the data-out lines of the second stages of cells 60-1 to 60-(n-1) are written into the first stages of the next cells 60-2 through 60-n. If the power has been turned off or lost and later restored, the "n" data bits stored in the register can be read in response to "n" clock pulses.

It should be apparent to those skilled in the art that many changes can be made in the details and arrangements of steps and parts without departing from the scope of the invention as defined in the appended claims.

What is claimed is:

1. An electrically operated register system adapted to receive power from a power source, said register system comprising:
    a data source for supplying data bit signals;
    a register connected to said data source for receiving data therefrom;
    a data sink connected to said register for receiving data therefrom;
    a selectively operated power supply adapted to be connected to the power source, for supplying power to said register when said power supply is turned on;
    said register having a plurality of register cells, each of said register cells comprising first and second stages, each stage comprising
        a thin-film amorphous floating-gate transistor (FGT) including a control gate, a drain, a source, a channel extending between said drain and said source, an insulator between said control gate and said channel, and a floating gate embedded in said insulator, said channel being conductive when a voltage signal of a first polarity is applied between said control gate and said source and non-conductive when a voltage signal of a polarity opposite to said first polarity is applied between said control gate and said source,
        a data-in line,
        a data-out line,
        an analog switch (AS) comprising a thin-film amorphous transistor having a gate for turning said analog switch on and off in response to switching signals applied thereto, and a drain and a source connected between said data-in line and said control gate of said FGT for coupling a data bit signal on said data-in line to said control gate when said AS is turned on to thereby capacitively charge said floating gate to represent such data bit;
    each register cell having the data-out line of its first stage coupled to the data-in line of its second stage;
    a switching pulse generator connected to said AS of each register cell, for supplying a first switching pulse to said ASs of all of said first stages to write data bits into said first stages and a second switching pulse to said ASs of all of said second stages to transfer the data bits in each of said first stages into each of said second stages; and
    said FGTs of said register cells being operative to non-volatilely store data bits when said power supply ceases to supply power to said register.

2. A register system in accordance with claim 1, wherein said register cells are connected in series with each data-out line from the second stage of a previous cell being connected to the data-in line of the first stage of the next cell whereby said first timing pulse shifts data bits between the register cells.

3. A register system in accordance with claim 2, comprising:
    a clock for generating a series of clock pulses;

said data source being operative to supply a series of data bit signals in synchronism with said clock pulses; and said switching pulse generator being operative to generate said first and second switching signals in synchronism with said data bit signals thereby operating said register as a serial-in, serial-out shift register.

4. A register system in accordance with claim 2, comprising:

first and second voltage supply lines connected to said power supply for providing first and second voltages of opposite polarity;

each stage further comprises a first load device connected between said first voltage supply line and said FGT in such stage, for limiting current in said FGT when such FGT is conductive, a source follower coupled to said FGT and said data-out line, and a second load device connected between said source follower and said second voltage supply line for limiting current through said source follower.

5. A register system in accordance with claim 2, comprising:

first and second voltage supply lines connected to said power supply for providing first and second voltages of opposite polarity;

each stage further comprises a first load device connected between said first voltage supply line and said drain of said FGT in such stage, for limiting current in said FGT when such FGT is conductive, a source follower having a gate coupled to said drain of said FGT, a drain coupled to said first voltage supply line, and a source coupled with said data-out line, and a second load device connected between said source of said source follower and said second voltage supply line for limiting current through said source follower; and said source follower being operative to generate a data signal on said data-out line which is of a polarity opposite to the polarity of a data bit signal on said data-in line of the stage.

6. A register system in accordance with claim 3, wherein:

said shift register has "n" register cells; and said clock generates "n" clock pulses for writing "n" data bits into said shift register.

7. A register system in accordance with claim 3, comprising:

said shift register has "n" register cells; and said clock generates "n" clock pulses for reading "n" data bits out of said shift register.

8. An electrically operated shift register system adapted to receive power from a power source, said register system comprising:

a selectively operated power supply adapted to be connected to the power source for supplying positive and negative voltages;

a clock for generating a series of clock pulses;

a data source for supplying a series of data bit signals in synchronism with said clock pulses;

a data sink for receiving data;

a shift register having an input line coupled to said data source for receiving said data bit signals and an output line coupled to said data sink, said shift register being coupled to said power supply and further comprising a first bus for receiving a positive voltage from said power supply and a second bus for receiving a negative voltage from said power supply, said register further comprising a plurality of register cells and a clock generator;

each of said register cells comprising first and second stages, each stage comprising a thin-film amorphous silicon (A-Si) floating-gate transistor (FGT) including a control gate, a drain, a source, an N-channel extending between said drain and said source, an insulator between said control gate and said N-channel, and a floating gate embedded in said insulator, said channel being conductive when a positive voltage signal is applied between said control gate and said source and non-conductive when a negative voltage signal is applied between said control gate and said source, a data-in line, a data-out line, an analog switch (AS) comprising an N-type thin-film A-Si transistor having a gate for turning said analog switch on and off in response to switching signals applied thereto, and a drain and a source connected between said data-in line and said control gate of said FGT for coupling a data bit signal on said data-in line to said control gate when said AS is turned on to thereby capacitively charge said floating gate to represent such data bit, a first load device connected between said first bus and said drain of said FGT in such stage, for limiting current in said FGT when such FGT is conductive, a source follower having a gate coupled to said drain of said FGT, a drain coupled to said first bus, and a source coupled with said data-out line, and a second load device connected between said source of said source follower and said second bus for limiting current through said source follower, and said source follower being operative to generate a data signal on said data-out line which is of a polarity opposite to the polarity of a data bit signal on said data-in line of the stage;

each register cell having the data-out line of its first stage coupled to the data-in line of its second stage;

each preceding register cell having the data-out line of its second stage coupled to the data-in line of the first stage of the next register cell;

said clock generator being connected to each AS of each register cell, for supplying a first switching pulse to said ASs of all of said first stages to thereby write data bits into said first stages and a second switching pulse to said ASs of all of said second stages to transfer the data bits in each of said first stages into each of said second stages; and said FGTs of said register cells being operative to non-volatilely store data bits when said power supply ceases to supply power to said register.

9. A register system in accordance with claim 8, wherein:

said shift register has "n" register cells; and said clock generates "n" clock pulses for writing "n" data bits into said shift register.

10. A register system in accordance with claim 8, comprising:

said shift register has "n" register cells; and said clock generates "n" clock pulses for reading "n" data bits out of said shift register.

* * * * *